(12) United States Patent
Seo et al.

(10) Patent No.: US 8,426,841 B2
(45) Date of Patent: Apr. 23, 2013

(54) TRANSPARENT MEMORY FOR TRANSPARENT ELECTRONIC DEVICE

(75) Inventors: Jung Won Seo, Daejeon-si (KR); Keong Su Lim, Daejeon-si (KR); Jae Woo Park, Seongnam-si (KR); Ji Hwan Yang, Daejeon-si (KR); Sang Jung Kang, Daejeon-si (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 69 days.

(21) Appl. No.: 13/128,983

(22) PCT Filed: Jul. 23, 2009

(86) PCT No.: PCT/KR2009/004104
§ 371 (c)(1),
(2), (4) Date: Aug. 4, 2011

(87) PCT Pub. No.: WO2010/055988
PCT Pub. Date: May 20, 2010

(65) Prior Publication Data
US 2012/0132882 A1    May 31, 2012

(30) Foreign Application Priority Data
Nov. 13, 2008  (KR) .................. 10-2008-0112792
Apr. 30, 2009  (KR) .................. 10-2009-0038099

(51) Int. Cl.
*H01L 29/02* (2006.01)
(52) U.S. Cl.
USPC ..... 257/4; 257/2; 257/E29.002; 257/E47.001; 438/102; 438/103; 438/104; 365/163

(58) Field of Classification Search ............... 257/2–5, 257/E29.002, E47.001; 438/102–104; 365/163
See application file for complete search history.

(56) References Cited

U.S. PATENT DOCUMENTS

| | | | |
|---|---|---|---|
| 6,876,003 B1 * | 4/2005 | Nakamura et al. | 257/81 |
| 7,442,588 B2 | 10/2008 | Jang et al. | |
| 2007/0176264 A1 | 8/2007 | Lee et al. | |
| 2007/0252193 A1 | 11/2007 | Cho et al. | |
| 2008/0007988 A1 | 1/2008 | Ahn et al. | |

FOREIGN PATENT DOCUMENTS

| | | |
|---|---|---|
| KR | 00759086 B1 | 2/2007 |
| KR | 20070075812 A | 7/2007 |
| KR | 20070106224 A | 11/2007 |
| KR | 100790882 B1 | 1/2008 |

* cited by examiner

*Primary Examiner* — Jami M Valentine
(74) *Attorney, Agent, or Firm* — The Webb Law Firm

(57) ABSTRACT

The present invention relates to a transparent memory for a transparent electronic device. The transparent memory includes: a lower transparent electrode layer that is sequentially formed on a transparent substrate, and a data storage region and an upper transparent layer which are made of at least one transparent resistance-variable material layer. The transparent resistance-variable material layer has switching characteristics as a result of the resistance variance caused by the application of a certain voltage between the lower and upper transparent electrode layers. An optical band gap of the transparent resistance-variable material layer is 3 eV or more, and transmittivity of the material layer for visible rays is 80% or more. The invention provides transparent and resistance-variable memory that: has very high transparency and switching characteristics depending on resistance variation at a low switching voltage, and can maintain the switching characteristics thereof after a long time elapses.

15 Claims, 10 Drawing Sheets

TRANSPARENT MEMORY FOR TRANSPARENT ELECTRONIC DEVICE

TECHNICAL FIELD

The present invention relates, in general, to transparent memory for a transparent electronic device and, more particularly, to a transparent memory device, in which transparent electrodes and a transparent resistance-variable material are stacked on a transparent substrate and which realizes high visible light transmittance and obtains excellent switching characteristics, and to transparent memory which is required to apply the transparent memory device to a transparent electronic device.

BACKGROUND ART

Generally, semiconductor memory devices are mainly divided into volatile memory and non-volatile memory according to a driving method. Dynamic Random Access Memory (DRAM), which is a representative volatile memory device, includes a single transistor and a single capacitor. Such DRAM is advantageous in that the operating speed thereof is very high, and the degree of integration is also very high, thus enabling large-capacity memory to be implemented. However, DRAM is disadvantageous in that since a capacitor must be continuously recharged with electric charges, power consumption is high, and, in particular, in that DRAM is volatile memory in which all data stored therein is erased when the supply of power to the DRAM is interrupted.

Unlike this, a non-volatile memory device is advantageous in that even if power is turned off, data stored in the memory can be retained for a long period of time. A representative non-volatile memory device includes flash memory. However, flash memory is disadvantageous in that operating voltage is high, and operating speed is much lower than that of DRAM.

Accordingly, extensive research has been conducted into new memory devices capable of solving the disadvantages of DRAM which is a volatile memory device and flash memory which is a non-volatile memory device, and maximizing the advantages thereof, for example, a Phase change Random Access Memory (PRAM) device that uses a resistance variation when a phase change between materials occurs, Magnetic Random Access Memory (MRAM) that uses a variation in the giant magneto-resistance of a ferromagnetic body, Ferroelectric Random Access Memory (FRAM) that uses the polarization of a ferroelectric body, and Resistive Random Access Memory (RRAM or ReRAM) that uses the resistance variation characteristics of a material.

Among the above memory devices, RRAM generally has a Metal/Metal Oxide (Insulator)/Metal (MIM) structure based on a metal oxide, and exhibits characteristics as a memory device in such a way that when a suitable electrical signal is applied to a metal oxide, the state of the metal oxide changes from a High Resistance State (HRS or OFF state) to a Low Resistance State (LRS or ON state), or vice versa.

Resistance can be classified into Current Controlled Negative Differential Resistance (CCNR) and Voltage Controlled Negative Differential Resistance (VCNR) according to an electrical method of implementing ON/OFF switching memory characteristics. In particular, in the case of VCNR, current exhibits the characteristics of, as voltage increases, changing from a high current state to a low current state. By using a large difference between the resistances appearing at that time, memory characteristics can be implemented.

A lot of research into the switching characteristics of a metal oxide that has a resistance state changing with an applied voltage has been conducted for a long period of time, and, as a result, two switching models have been presented. First, a certain structural variation is caused in a metal oxide, and thus a high conductivity path having a resistance state differing from that of the original metal oxide is formed. This is a conducting filament model. According to this model, an electrode metal material is diffused or injected into a thin film by an electrical stress (typically called a forming process), or, alternatively, defective structures in the thin film are rearranged, and thus a conducting filament having very high conductivity is formed. This conducting filament exhibits switching characteristics, because of the repetition of a phenomenon in which the conducting filament is broken due to joule heating occurring in a local area and is re-formed due to factors, such as the internal temperature and external temperature of the thin film, an applied electric field, and space charges. Second, there is a switching model based on a large number of traps present in a metal oxide. Generally, the metal oxide includes a large number of traps related to metal particles or oxygen particles. It is known that such a switching model exhibits switching characteristics in such a way that when the traps are charged with electric charges and the electric charges are discharged from the traps, band bending occurs in the interface between an electrode and a thin film, or, alternatively, a variation in an internal electric field is caused due to space charges.

Using these mechanisms, an RRAM device exhibits an operating speed (several tens of nsec) much higher than that of existing flash memory, and can be operated even at a low voltage (2 to 5 V or less) as in the case of DRAM. Further, such an RRAM device has advantages in that it enables fast reading-writing as in the case of SRAM, and has a simple memory device structure not only to reduce defects that may occur in a manufacturing process, but also to reduce manufacturing costs, thus enabling inexpensive memory devices to be manufactured. Furthermore, since the RRAM device is rarely influenced by cosmic radiation, electromagnetic waves, or the like, it can exhibit its own functions even in cosmic space, and memory performance does not deteriorate even if writing and erasure are repeated $10^{10}$ times or more. Thanks to these advantages, the RRAM device can be applied to all devices requiring storage media, and has characteristics suitable for the purpose of a memory device that has become implemented as, especially, a System-on-a-Chip (SoC) such as an embedded Integrated Circuit (IC).

In the prior art, a single crystal silicon substrate, a Silicon On Insulator (SOI) substrate, or the like has been used as the substrate of memory. Since memory that uses such a substrate is not transparent, it is impossible not only to manufacture a transparent electronic device that can be applied to transparent displays or the like, but also to directly apply electronic devices to transparent electronic products such as large-size transparent displays or the like because memory is influenced by the size of a substrate when being manufactured.

DISCLOSURE

Technical Problem

An object of the present invention is intended to provide a transparent resistive memory device, which, in resistive memory, has very high transparency, has excellent switching characteristics depending on resistance variations even at a low switching voltage, and is capable of maintaining switching characteristics as stable resistive memory even after a long period of time has elapsed.

Another object of the present invention is to provide a memory device, which can be produced at low costs, is not influenced by the size of a substrate when a transparent resistive memory device is manufactured, and is capable of being directly applied to electronic devices mounted on a transparent large-size display or the like, and to also provide memory required to apply the memory device to a transparent electronic device.

A further object of the present invention is to provide transparent memory, which is not damaged by bending or the like attributable to external force and is capable of being applied to a transparent electronic device that is flexible and is easily portable.

Technical Solution

In order to accomplish the above objects, the present invention provides transparent memory for a transparent electronic device, including a lower transparent electrode layer, a data storage area, and an upper transparent electrode layer sequentially formed on a transparent substrate, the data storage area being formed as at least one transparent resistance-variable material layer, wherein the transparent resistance-variable material layer has switching characteristics depending on resistance variations based on a predetermined voltage that is applied between the lower transparent electrode layer and the upper transparent electrode layer, has an optical band gap of 3 eV or more, and has a visible light transmittance of 80% or more.

Preferably, the data storage area may be formed in such a way that at least two transparent resistance-variable material layers are bound to each other in a heterojunction manner.

In this case, the transparent resistance-variable material layer may include at least one of zinc (Zn), titanium (Ti), hafnium (Hf), zirconium (Zr), aluminum(Al), tantalum (Ta), yttrium (Y), vanadium (V), chromium (Cr), manganese (Mn), iron (Fe), cobalt (Co), nickel (Ni), copper (Cu), niobium (Nb), and molybdenum (Mo), as a transition metal oxide.

Alternatively, the transparent resistance-variable material layer may include manganese (Mn), which is a metal material having magneto-resistance, as a metal oxide having magneto-resistance.

Further, the transparent resistance-variable material layer may further include at least one of compounds of strontium (Sr), zirconium (Zr) and titanium (Ti), as a ferroelectric material.

Furthermore, the data storage area may be formed as at least two transparent resistance-variable material layers, and the transparent resistance-variable material layers may be made of one type of transition metal oxide having different oxygen compositions.

Preferably, each of the lower transparent electrode layer and the upper transparent electrode layer may include any one selected from among a transparent conducting oxide (TCO), a transparent conducting polymer, and a transparent conducting carbon nano tube (CNT).

In this case, the transparent conducting oxide may be one of zinc oxide (ZnO), tin oxide ($SnO_2$), indium zinc oxide (IZO), indium tin zinc oxide (ITZO), and indium tin oxide (ITO), and the conducting polymer may be either poly(3,4-ethylenedioxythiophene)-poly(styrene sulfonate) (PEDOT-PSS) or polyaniline (PANi).

Furthermore, the transparent substrate may be made of any one selected from among glass, a polymer, and plastic.

Preferably, the transparent memory further include a plurality of transparent bit lines arranged in parallel in a vertical direction to be spaced apart from one another by a predetermined interval; and a plurality of transparent word lines arranged in parallel in a lateral direction to be spaced apart from one another by a predetermined interval, wherein data storage areas are formed between the transparent bit lines and the transparent word lines at intersections of the transparent bit lines and the transparent word lines, a transparent bit line at each intersection acts as an upper transparent electrode layer, and a transparent word line at each intersection acts as a lower transparent electrode layer.

More preferably, the transparent bit lines and the transparent word lines are alternately arranged to form a multi-layer structure, and a transparent bit line or a transparent word line disposed on a top of a relevant data storage area acts as an upper transparent electrode layer, and a transparent bit line or a transparent word line disposed on a bottom of the data storage area acts as a lower transparent electrode layer.

Furthermore, the transparent memory may further include a transparent switching thin film transistor configured to control application of a predetermined voltage between the lower transparent electrode layer and the upper transparent electrode layer, thus forming a single memory cell.

In this case, the lower transparent electrode layer may be connected to a source electrode of the transparent switching thin film transistor, and the memory cell may be operated in response to a gate electrode signal of the transparent switching thin film transistor.

Further, the transparent memory may further include a plurality of transparent bit lines arranged in parallel in a vertical direction to be spaced apart from one another by a predetermined interval; and a plurality of transparent word lines arranged in parallel in a lateral direction to be spaced apart from one another by a predetermined interval, wherein memory cells are formed between the transparent bit lines and the transparent word lines at intersections of the transparent bit lines and the transparent word lines, so that a gate electrode of a transparent switching thin film transistor of each memory cell is connected to a transparent word line at a corresponding intersection, and a transparent bit line at the corresponding intersection acts as an upper transparent electrode layer.

Preferably, the bit lines and the word lines are alternately arranged to form a multi-layer structure, and a bit line or a word line disposed on a top of a data storage area of the memory cell acts as an upper transparent electrode layer, and a bit line or a word line disposed on a bottom of the data storage area is connected to the gate electrode of the transparent switching thin film transistor of the memory cell.

Advantageous Effects

According to the present invention, there can be provided transparent resistive memory, which has very high transparency, has excellent switching characteristics depending on resistance variations even at a low switching voltage, and is capable of maintaining the switching characteristics of the resistive memory even after a long period of time has elapsed.

Further, the present invention is advantageous in that when a transparent resistive memory device is manufactured, a substrate can be made of an inexpensive material such as glass, a polymer or plastic, thus reducing manufacturing costs.

Furthermore, the present invention is configured such that a resistance-variable material layer is formed as a multi-layer, thus increasing memory capacity and improving operating characteristics while reducing the size of the memory.

Since the above-described transparent resistive memory is not influenced by the size of a substrate when the transparent memory device is manufactured, it can be directly applied to a transparent large-size electronic device.

Furthermore, since a flexible substrate is used, a transparent electronic device that is not damaged by bending or the like attributable to external force and is flexible and easily portable can be manufactured.

Figure 1:
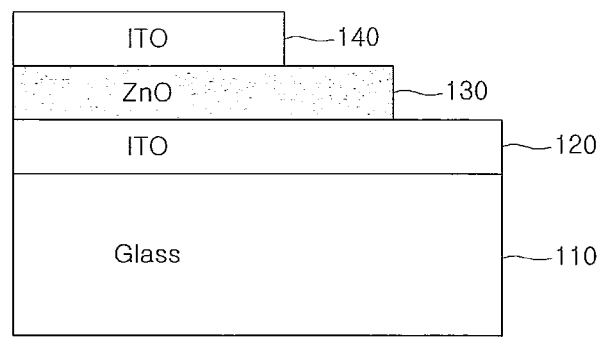
FIGS. 1 to 3 are views showing an embodiment of transparent memory for a transparent electronic device according to the present invention.

DESCRIPTION OF REFERENCE NUMERALS OF PRINCIPAL ELEMENTS IN THE DRAWINGS 100, 100a~100h: transparent memory device
110: transparent substrate
120, 120a~120h: lower transparent electrode layer
130, 130a~130h: data storage area
140, 140a~140h: upper transparent electrode layer
200, 200a~200h: transparent switching thin film transistor
WL, WLa, WLb: transparent word line
BL, BLa: transparent bit line Best Mode The present invention provides transparent memory for a transparent electronic device, which has very high transparency and switching characteristics depending on resistance variations even at a low switching voltage, and which includes layers sequentially stacked on a transparent substrate, that is, a lower transparent electrode layer, a data storage area implemented as a transparent resistance-variable material layer, and an upper transparent electrode layer. Further, the data storage area can be formed as two or more transparent resistance-variable material layers, thus enabling the provision of transparent memory that increases memory capacity and further improves operating characteristics while reducing the size of the memory.

Mode for Invention

Hereinafter, preferred embodiments of the present invention will be illustrated and referred to so as to describe the present invention, the operating advantages thereof, and objects to be achieved by the implementation of the present invention.

FIG. 1 is a view showing an embodiment of transparent memory for a transparent electronic device according to the present invention.

The memory of the present invention includes layers sequentially stacked on a transparent substrate 110, that is, a lower transparent electrode layer 120, a data storage area 130 implemented as a transparent resistance-variable material layer, and an upper transparent electrode layer 140.

In the embodiment of FIG. 1, glass is used for the transparent substrate 110, and, in addition to the glass, a polymer or plastic can be used as a transparent insulating material which has a visible light transmittance of 80% or more and does not cause light distortion or refraction.

Although the transparent resistance-variable material layer 130 has been made of a zinc oxide (ZnO), it may be formed, in addition to ZnO, by stacking a transition metal oxide, a manganite oxide or a ferroelectric material so that visible light transparency is obtained and a visible light transmittance is 80% or more.

In more detail, the transparent resistance-variable material layer 130 can be made of any of stoichiometric transition metal oxides such as zinc oxide (ZnO), titanium oxide ($TiO_2$), hafnium oxide ($HfO_2$), zirconium oxide (ZrO), aluminum oxide ($Al_2O_3$), tantalum oxide ($Ta_2O_5$), vanadium oxide ($V_2O_5$), chromium oxide ($CrO_2$), manganese oxide ($MnO_2$), iron oxide ($Fe_2O_3$), cobalt oxide ($Co_2O_3$), nickel oxide (NiO), copper oxide (CuO), niobium oxide ($Nb_2O_5$), and molybdenum oxide ($MoO_3$), which are respectively formed by oxidizing transition metals such as zinc (Zn), titanium (Ti), hafnium (Hf), zirconium (Zr), aluminum (Al), tantalum (Ta), vanadium (V), chromium (Cr), manganese(Mn), iron (Fe), cobalt (Co), nickel (Ni), copper (Cu), niobium (Nb), and molybdenum (Mo), any of non-stoichiometric transition metal oxides such as zinc oxide ($ZnO_x$), titanium oxide ($TiO_x$), hafnium oxide ($HfO_x$), zirconium oxide ($ZrO_x$), aluminum oxide ($Al_xO_y$), tantalum oxide ($Ta_xO_y$), vanadium oxide ($V_xO_y$), chromium oxide ($CrO_x$), manganese oxide ($MnO_x$), iron oxide ($Fe_xO_y$), cobalt oxide ($Co_xO_y$), nickel oxide ($NiO_x$), copper oxide ($CuO_x$), niobium oxide ($Nb_2O_x$), and molybdenum oxide ($MoO_x$), any of manganite oxides such as $Pr_{1-x}Ca_xMnO_3$ (PCMO) and $La_{1-x}Ca_xMnO_3$ (LCMO), and any of ferroelectric materials such as $SrTiO_3$ and $SrZrO_3$.

Each of the lower transparent electrode layer 120 and the upper transparent electrode layer 140 is made of an indium tin oxide (ITO) widely used as a transparent electrode. However, in addition to ITO, a transparent conducting oxide (TCO), a transparent conducting polymer, a transparent conducting carbon nano tube (CNT), or the like can be used as a material which has a visible light transmittance of 80% or more and has excellent electrical conductivity.

A material, such as zinc oxide (ZnO), tin oxide ($SnO_2$), indium zinc oxide (IZO), indium tin zinc oxide (ITZO) or indium tin oxide (ITO), can be used as the transparent conducting oxide, and a material, such as poly (3,4-ethylenedioxythiophene)-poly (styrene sulfonate) (PEDOT-PSS) or polyaniline (PANi), can be used as the conducting polymer.

Figure 2:
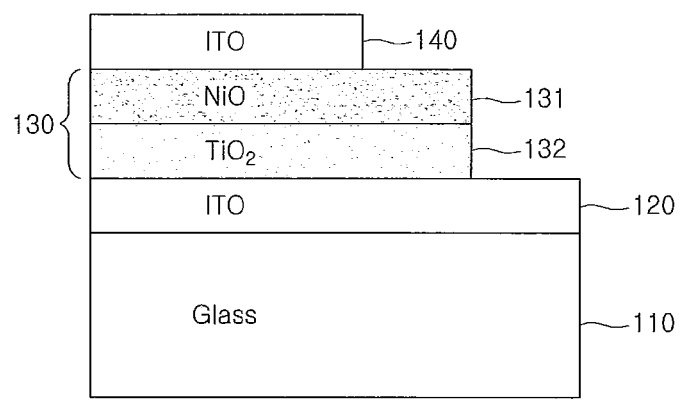
Figure 3:
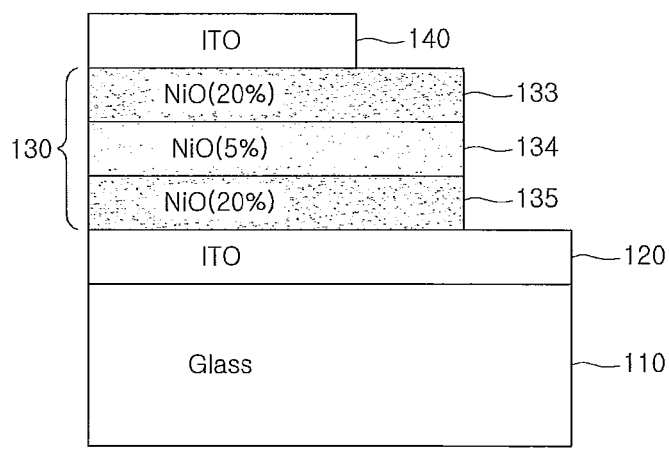

Furthermore, in the present invention, the data storage area may be formed as two or more transparent resistance-variable material layers. FIGS. 2 and 3 illustrate embodiments of transparent memory for a transparent electronic device, which has a data storage area formed as a plurality of transparent resistance-variable material layers, according to the present invention.

In the embodiment of FIG. 2, the data storage area 130 is formed by binding heterogeneous transparent resistance-variable material layers 131 and 132 to each other in a heterojunction manner. As the heterogeneous transparent resistance-variable material layers, a ZnO layer 131 and a $TiO_2$ layer 132 are formed.

When a plurality of transparent resistance-variable material layers are formed using heterojunction in this way, it is preferable to form the transparent resistance-variable material layers using two materials, the resistances of which have a large difference therebetween. In the embodiment of FIG. 2, the resistance of the initial $TiO_2$ layer 132 is much greater than that of the ZnO layer 131. In this case, when a voltage is applied according to a forming process, forming occurs first on the $TiO_2$ layer 132, and thereafter the resistance of the ZnO layer 131 is further increased, thus exhibiting the switching characteristics of the transparent resistance-variable material layer 130. Further, since the $TiO_2$ layer 132 and the ZnO layer 131 are connected in series, a resistance value in a low resistance state (ON-state) can be further increased.

Therefore, in the case of the embodiment of FIG. 2 according to the present invention, the resistance value in the low-resistance state (ON-state) is further increased, so that the driving of the memory is possible even at low reset current, thus enabling the switching operating characteristics of the memory to be further improved.

Moreover, when a plurality of transparent resistance-variable material layers are formed using one type of metal oxide, the individual transparent resistance-variable material layers can be formed to have different oxygen compositions.

In the embodiment of FIG. 3, the data storage area 130 having three transparent resistance-variable material layers is formed using ZnO. In this case, the data storage area 130 is formed so that the respective transparent resistance-variable material layers have different oxygen compositions.

As shown in FIG. 3, the data storage area 130 is formed using a layer 133, a layer 134 and a layer 135 respectively having oxygen contents of 20%, 5%, and 20% based on ZnO. When the data storage area 130 is formed as a multi-layer structure in this way, switching characteristics actually appear only on the NiO layer 134, which is made of a material having the highest resistance and has an oxygen content of 5%, during the forming process. Further, since the multi-layer structure in which layers are sequentially stacked adopts a series-connection manner, the resistance value in the low-resistance state (ON-state) increases, thus enabling the memory device to be stably driven even at low reset current, as in the case of the embodiment of FIG. 2.

Figure 4:
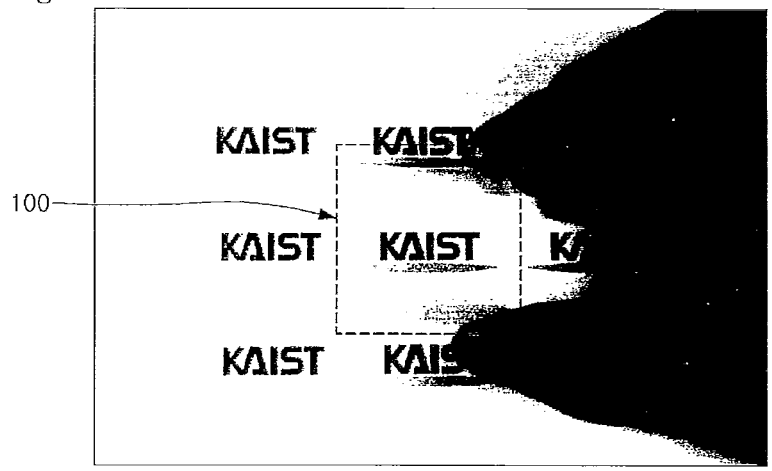
FIG. 4 is a view showing a picture of the actual product of the transparent memory for the transparent electronic device according to the present invention.

FIG. 4 is a view showing a picture of the actual product of the transparent memory for the transparent electronic device according to the present invention.

The transparent memory device 100 of FIG. 4 according to the present invention is formed using a commercialized glass substrate 110 on which ITO, which is the lower transparent electrode layer 120, is deposited. Here, the lower transparent electrode layer 120 has the characteristics of a thickness of 143 nm, a sheet resistance of 12 $\Omega/\square$, and a resistivity of $1.7 \times 10^{-4}$ $\Omega$cm.

A ZnO layer is deposited as the transparent resistance-variable material layer 130 on the top of the lower transparent electrode layer 120 using a shadow mask, wherein a substrate temperature is set to 200° C. and a processing pressure is adjusted to 2 Torr while Diethylzinc (DEZ) and $H_2O$ vapor) are injected into a chamber using argon (Ar) gas as a carrier gas, via Metalorganic Chemical Vapor Deposition (MOCVD), so that the ZnO layer is deposited for six minutes and is then formed to have a thickness of 100 nm.

Thereafter, the upper transparent electrode layer 140 is formed in such a way that an ITO layer is formed based on sputtering using a shadow mask and is annealed at a temperature of 250° C., and then the thickness of the ITO layer becomes 175 nm. The upper transparent electrode layer 140 has the characteristics of a sheet resistance of 25$\Omega/\square$ and a resistivity of $4.4 \times 10^{-4}$ $\Omega$cm.

As shown in FIG. 4, the transparent memory for the transparent electronic device according to the present invention can be used as a transparent memory device, which has high visible light transmittance to such an extent that characters located under the memory device are clearly viewed thanks to its very high transparency, and which does not have the deformation or distortion of light transmitted therethrough.

FIGS. 5 to 8 are graphs showing the results of analyzing the transparent memory for the transparent electronic device in FIG. 4 according to the present invention using a Semiconductor Parameter Analyzer (SPA).

Figure 5:
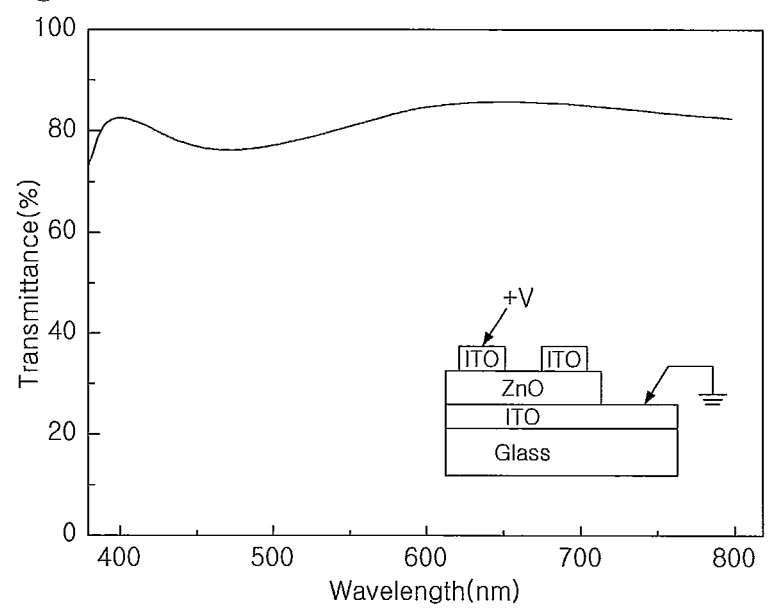
FIG. 5 is a graph showing the results of transmissivity of the transparent memory for the transparent electronic device according to the present invention.

FIG. 5 is a graph showing analyzed results related to the transmittance of the transparent memory for the transparent electronic device according to the present invention. As shown in FIG. 5, analyzed results indicating that the maximum transmittance is 86%, the minimum transmittance is 76%, and the average transmittance is 81% were obtained for visible light having a wavelength from 400 nm to 800 nm. Referring to the above results, the transparent memory for the transparent electronic device according to the present invention can be used as memory having very high transparency.

Figure 6:
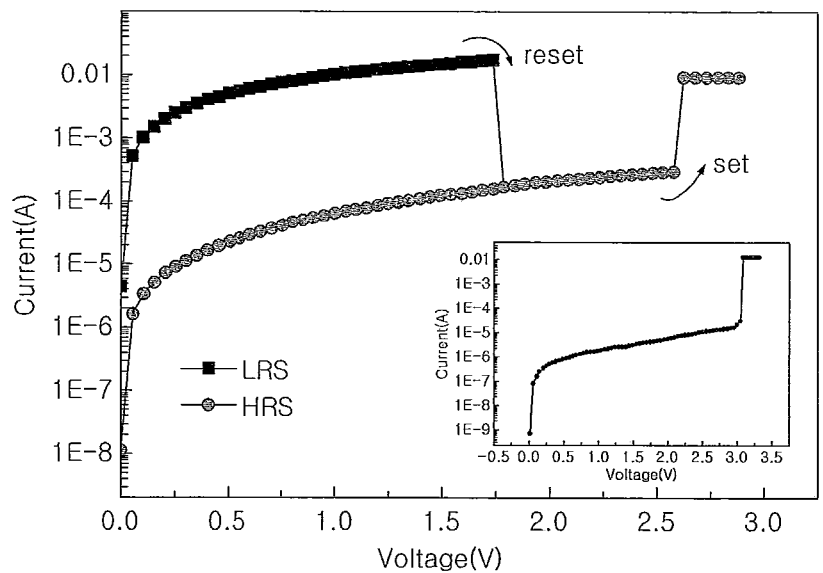
FIG. 6 is a view showing the resistance variation versus switching characteristics of the transparent memory for the transparent electronic device according to the present invention.

FIG. 6 is a view showing the resistance variation versus switching characteristics of the transparent memory for the transparent electronic device according to the present invention.

In FIG. 6, a lateral axis denotes an applied voltage, and a vertical axis denotes a current value relative to the applied voltage. In order to operate as non-volatile transparent resistive memory, an electrical stress (forming process) relative to a current response is required, wherein the forming voltage appears as about 3.2V. After an initial forming process, when voltage was applied to the transparent resistive memory while gradually increasing from 0, the transparent resistive memory was operated in a low resistance state (LRS: ON-state) and then reached a high resistance state (OFF-state) once a voltage of about 1.8V was applied. Further, when the voltage was applied again to the transparent resistive memory while gradually increasing from 0V, the transparent resistive memory returned to the low resistance state (ON-state) when a voltage of about 2.6 V was applied.

Referring to these results, it can be seen that since the transparent resistive memory according to the present invention can be changed to two different switching states according to the applied voltage, it can be operated as memory.

Figure 7:
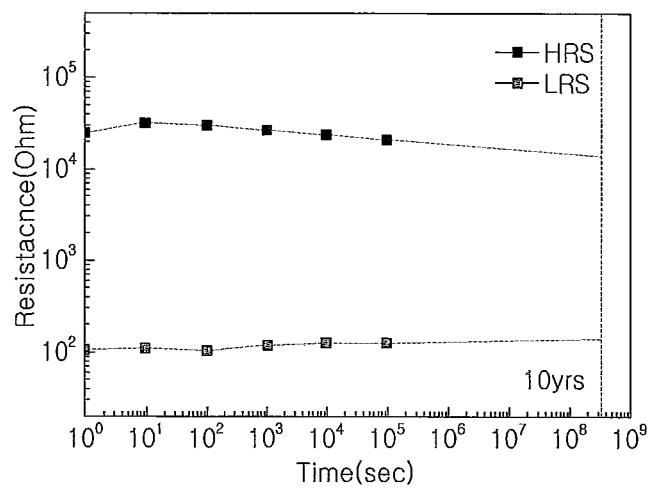
FIG. 7 is a graph showing the time variation versus resistance maintenance characteristics of the transparent memory for the transparent electronic device according to the present invention.

FIG. 7 is a graph showing the time variation versus resistance maintenance characteristics of the transparent memory for the transparent electronic device according to the present invention.

As shown in FIG. 7, it can be seen that the transparent memory for the transparent electronic device according to the present invention can maintain resistance characteristics in a high resistance state (HRS) and a low resistance state (LRS) for 105 seconds, without causing a sudden variation in resistance at room temperature, and that the transparent memory can maintain its characteristics as resistive memory, during a period of 10 years or longer, based on extrapolation.

Figure 8:
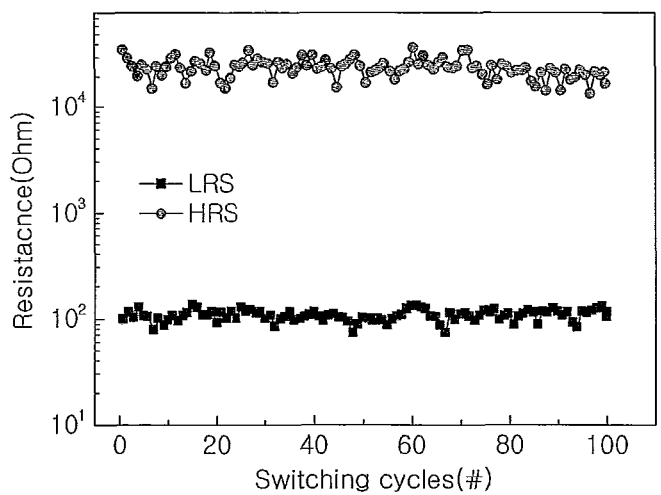
FIG. 8 is a view showing the results of testing the switching characteristics of the transparent memory for the transparent electronic device according to the present invention.

FIG. 8 is a view showing the results of testing the switching characteristics of the transparent memory for the transparent electronic device according to the present invention.

As shown in the graph of FIG. 8, it can be seen that although a slight variation occurred in the resistance values in the high resistance state (HRS) and the low resistance state (LRS), stable switching characteristics can be maintained for 100 cycles.

FIGS. 9 to 12 are views showing a process for manufacturing transparent memory for a transparent electronic device, which has a single transparent resistance-variable material layer, according to the present invention. Hereinafter, the manufacture of the transparent memory for the transparent electronic device according to the present invention will be described in detail with reference to FIGS. 9 to 12.

Figure 9:
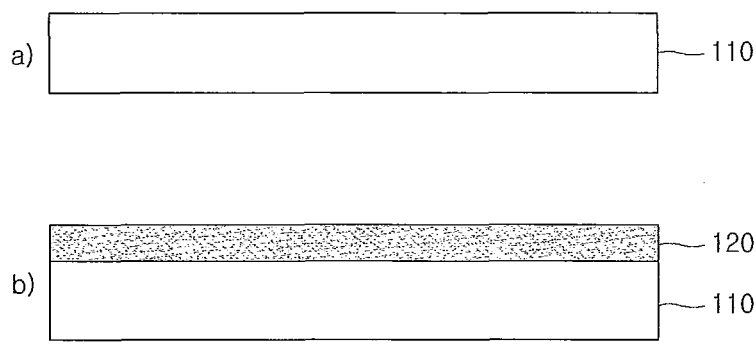
FIGS. 9 to 12 are views showing a process for manufacturing the transparent resistive memory device according to the present invention.

Referring to FIG. 9, a lower transparent electrode layer 120 to be used as a lower electrode is formed on a substrate 110. Here, the transparent substrate 110 is a main body constituting the transparent memory. The transparent substrate 110 is preferably made of a transparent insulating material, which has a visible light transmittance of 80% or more and does not have light distortion or refraction, so as to implement the transparent memory.

The lower transparent electrode layer 120 is a common lower electrode of the transparent memory. Accordingly, similarly to the transparent substrate 110, the lower transparent electrode layer 120 is preferably made of a material which has a visible light transmittance of 80% or more and has excellent electrical conductivity. For example, a transparent conducting oxide (TCO) such as zinc oxide (ZnO), tin oxide ($SnO_2$), indium zinc oxide (IZO), indium tin zinc oxide (ITZO) or indium tin oxide (ITO), a transparent conducting polymer such as poly (3,4-ethylenedioxythiophene)-poly (styrene sulfonate) (PEDOT-PSS) or polyaniline (PANi), and a transparent carbon nano tube (CNT) having excellent conductivity, can be used. As shown in FIG. 9b, the lower transparent electrode layer 120 can be deposited by applying, to the above materials, a Physical Vapor Deposition (PVD) method such as existing sputtering, an oxidation method of reacting the materials with oxygen in a high-temperature furnace after the PVD method has been performed, or a spin coating method of coating a solution-state sample.

Figure 10:
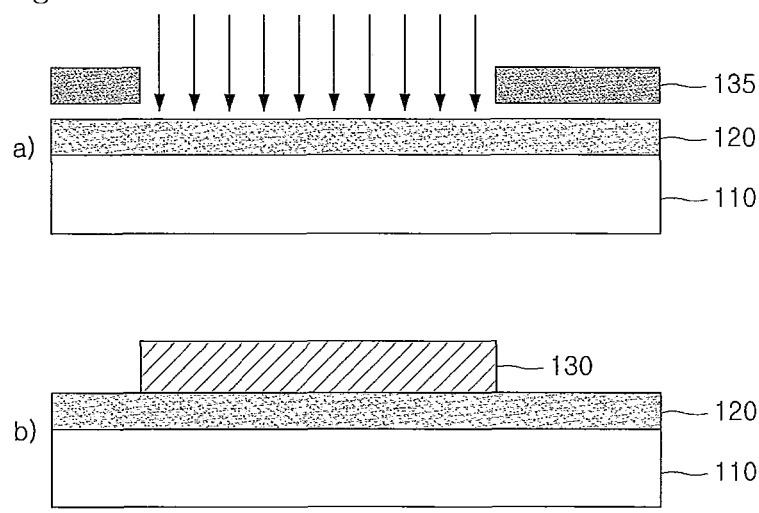
Figure 11:
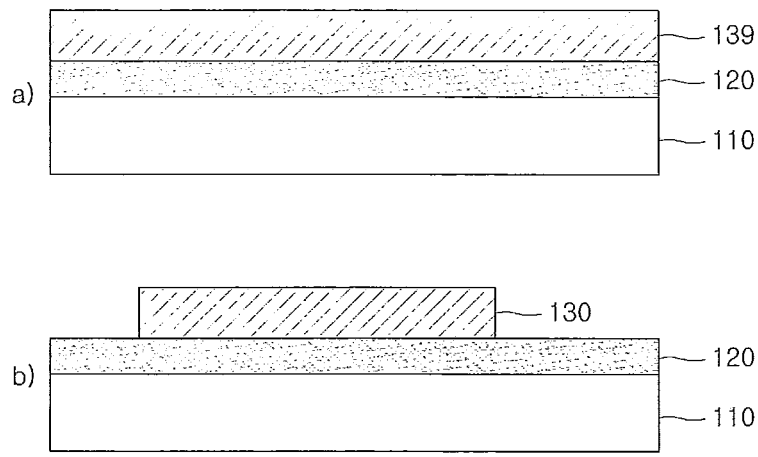

FIGS. 10 and 11 are views showing a process for forming the transparent resistance-variable material layer.

A data storage area 130 which is a transparent resistance-variable material layer is a core part of the resistive memory device, in which the switching of a memory device occurs. Under special conditions based on the application of voltage or current, a resistance-variable material undergoes resistance variations in a direction from a high resistance state to a low resistance state, or in the opposite direction, and exhibits switching characteristics, and is then used in resistive memory. In order for the data storage area 130 which is the transparent resistance-variable material layer to be applied to the transparent memory, the data storage area 130 must have the characteristics of the optical band gap of the material being 3 eV or more and the visible light transmittance being 80% or more.

The transparent resistance-variable material layer can be representatively made of any of stoichiometric transition metal oxides such as zinc oxide (ZnO), titanium oxide ($TiO_2$), hafnium oxide ($HfO_2$), zirconium oxide (ZrO), aluminum oxide ($Al_2O_3$), tantalum oxide ($Ta_2O_5$), vanadium oxide ($V_2O_5$), chromium oxide ($CrO_2$), manganese oxide ($MnO_2$), iron oxide ($Fe_2O_3$), cobalt oxide ($Co_2O_3$), nickel oxide (NiO), copper oxide (CuO), niobium oxide ($Nb_2O_5$), and molybdenum oxide ($MoO_3$), which are respectively formed by oxidizing transition metals such as zinc (Zn), titanium (Ti), hafnium (Hf), zirconium (Zr), aluminum (Al), tantalum (Ta), vanadium (V), chromium (Cr), manganese(Mn), iron (Fe), cobalt (Co), nickel (Ni), copper (Cu), niobium (Nb), and molybdenum (Mo), any of non-stoichiometric transition metal oxides such as zinc oxide ($ZnO_x$), titanium oxide ($TiO_x$), hafnium oxide ($HfO_x$), zirconium oxide ($ZrO_x$), aluminum oxide ($Al_xO_y$), tantalum oxide ($Ta_xO_y$), vanadium oxide ($V_xO_y$), chromium oxide ($CrO_x$), manganese oxide ($MnO_x$), iron oxide ($Fe_xO_y$), cobalt oxide ($Co_xO_y$), nickel oxide ($NiO_x$), copper oxide ($CuO_x$), niobium oxide ($Nb_2O_x$), and molybdenum oxide ($MoO_x$), any of manganite oxides such as $Pr_{1-x}Ca_xMnO_3$ (PCMO) and $La_{1-x}Ca_xMnO_3$ (LCMO), and any of ferroelectric materials such as $SrTiO_3$ and $SrZrO_3$.

Similarly to the lower transparent electrode layer 120, the above materials can also be deposited using a PVD method such as existing sputtering, an oxidation method of reacting the materials with oxygen in a high-temperature furnace after the PVD method has been performed, or a Chemical Vapor Deposition (CVD) method of performing deposition by thermally decomposing a vapor metal organic compound (MO source) and reacting the MO source with oxygen. In order to drive the transparent resistive memory device, the upper and lower transparent electrode layers are individually required, and for this, the lower transparent electrode layer 120 must be partially exposed.

In order to expose the lower transparent electrode layer 120, there can be used a method of utilizing a shadow mask 10 on the lower transparent electrode layer 120 and preventing the data storage area 130, which is the resistance-variable material layer, from being deposited on a part of the lower transparent electrode layer 120 covered with the shadow mask 10 when the transition metal oxide layer 130 is deposited, as shown in FIG. 10. Alternatively, as shown in FIG. 11, a resistance-variable material layer 139 is deposited on the entire surface of the lower transparent electrode layer 120, and a part of the resistance-variable material layer 139 is etched using dry etching or wet etching based on typical lithography, so that the data storage area 130 which is the resistance-variable material layer is formed, and thus the part of the lower transparent electrode layer 120 can be exposed.

Figure 12:
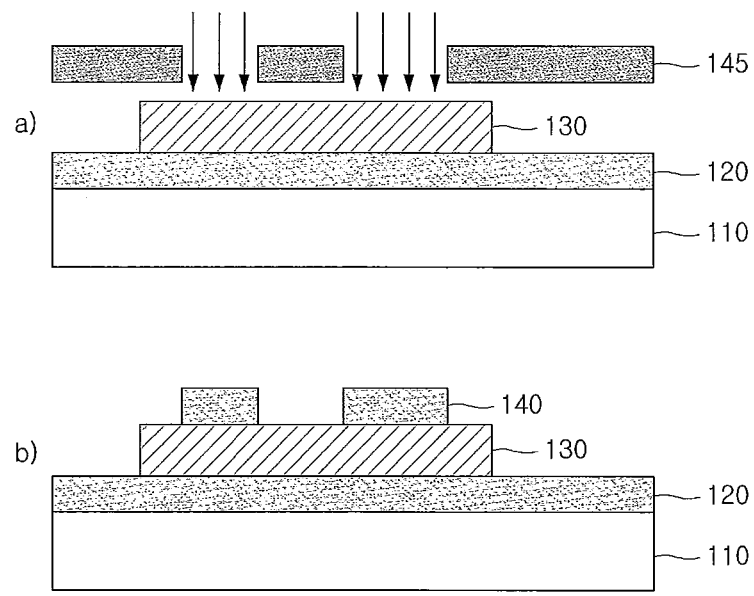

FIG. 12 illustrates a process for forming the upper transparent electrode layer.

Similarly to the lower transparent metal layer 120, the upper transparent metal layer 140 is also preferably made of a material which has a visible light transmittance of 80% or more and has excellent electrical conductivity. Further, similarly to that of the lower metal layer 120, a usable material includes a transparent conducting oxide (TCO) such as zinc oxide (ZnO), tin oxide ($SnO_2$), indium zinc oxide (IZO), indium tin zinc oxide (ITZO) or indium tin oxide (ITO), a transparent conducting polymer such as poly(3,4-ethylenedioxythiophene) poly(styrene sulfonate) (PEDOT-PSS) or polyaniline (PANi), a transparent carbon nano tube (CNT) having excellent conductivity, etc. Further, the lower transparent electrode layer can be deposited using a Physical Vapor Deposition (PVD) method such as existing sputtering, an oxidation method of reacting the materials with oxygen in a high-temperature furnace after the PVD method has been performed, or a spin coating method of coating a solution-state sample.

More preferably, as shown in FIG. 12, the upper transparent metal layer 140 can be easily formed using a shadow mask 20, as shown in FIG. 12a, without using existing lithography, and FIG. 12b illustrates transparent memory for a transparent electronic device, which has been finally manufactured through the above process.

As the result of testing the electrical characteristics of the transparent memory for the transparent electronic device according to the present invention, there can be provided transparent memory which has very high transparency, has switching characteristics depending on resistance variations even at a low switching voltage, and is capable of maintaining switching characteristics as stable resistive memory even after a long period of time has elapsed.

Figure 13:
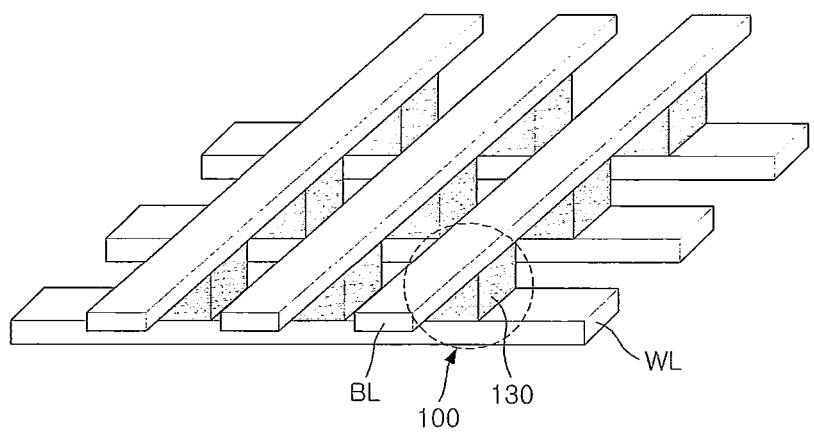
FIGS. 13 to 17 are views showing embodiments in which a transparent memory array is formed using the transparent resistive memory device according to the present invention.

In the case of the transparent memory for the transparent electronic device according to the present invention, a memory array is formed and can be used as the memory of each cell of the transparent electronic device. FIG. 13 illustrates an embodiment in which a memory array is formed according to the present invention.

As shown in FIG. 13, a plurality of transparent bit lines BL are arranged in parallel in a vertical direction and are spaced apart from one another by a predetermined interval, a plurality of transparent word lines WL are arranged in parallel in a lateral direction and are spaced apart from one another by a predetermined interval, and data storage areas 130, each formed as a transparent resistance-variable material layer, are disposed at the intersections of the transparent bit lines BL and the transparent word lines WL, thus forming a single memory device 100.

In this case, each transparent bit line BL is an upper transparent electrode layer, and each transparent word line WL is a lower transparent electrode layer, so that voltage is applied to each data storage area 130, and a potential difference occurs on a transparent resistance-variable material layer, thus enabling a resistance-variable material to be driven as the resistive memory.

As shown in FIG. 13, it is preferable that the transparent bit lines BL, the data storage areas 130 which are transparent resistance-variable material layers, and the transparent word lines WL be sequentially stacked. In this case, each of the transparent bit lines BL and the transparent word lines WL may be made of a transparent electrode-forming material such as indium tin oxide (ITO), zinc oxide (ZnO), tin oxide ($SnO_2$), indium zinc oxide (IZO), indium tin zinc oxide (ITZO), carbon nano tube (CNT), or nickel oxide ($NiO_x$).

In this way, the plurality of transparent bit lines BL and the plurality of transparent word lines WL are provided, and the data storage areas 130 are disposed at the intersections thereof, so that a single data storage area 130 is operated as a single memory device 100, and a plurality of memory devices are arranged to form a matrix-type memory array, as shown in FIG. 13.

Figure 14:
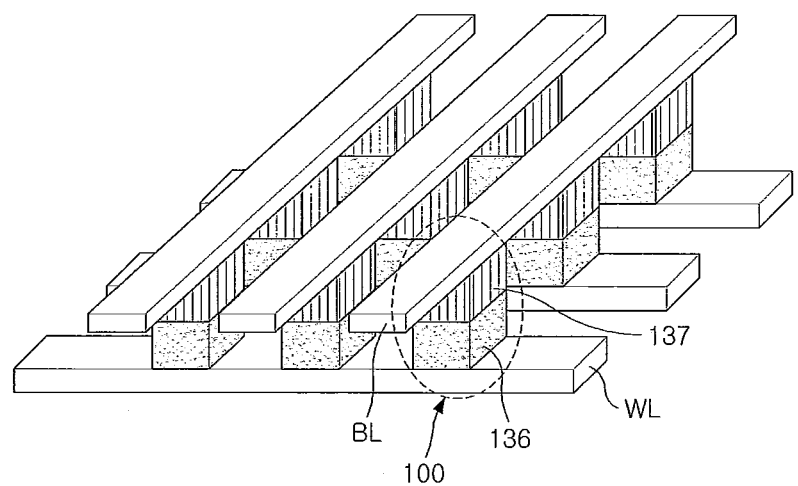
Figure 15:
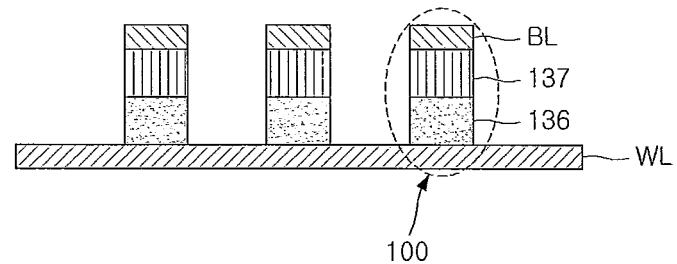

Furthermore, in the embodiment of FIG. 13, the transparent resistance-variable material layer of each data storage area 130 is formed as a single layer, but the data storage area may be formed as two or more transparent resistance-variable material layers so as to more effectively implement operating characteristics as a memory device. FIGS. 14 and 15 illustrate embodiments in which the data storage area is formed as two transparent resistance-variable material layers according to the present invention.

FIG. 14 is a perspective view showing an embodiment in which two transparent resistance-variable material layers are formed, and FIG. 15 is a sectional view showing the embodiment of FIG. 14. The embodiment of FIGS. 14 and 15 is implemented such that, similarly to the embodiment of FIG. 13, data storage areas 130 are disposed at the intersections of a plurality of transparent bit lines BL and a plurality of transparent word lines WL, wherein each of the data storage areas 130 has two heterogeneous resistance-variable material layers 136 and 137, and wherein a transparent bit line, a transparent word line, and a data storage area which are disposed at each intersection function as a single memory device 100. At this time, two resistance-variable material layers 136 and 137 are preferably made of materials having a large difference between the resistances thereof, as in the case of the embodiment of FIG. 2. In the operating relationship thereamong, a relevant transparent bit line BL is an upper transparent electrode layer and a relevant transparent word line WL is a lower transparent electrode layer, so that the memory is operated in the same manner as that of the embodiment of FIG. 2, and thus a detailed description thereof will be omitted.

Figure 16:
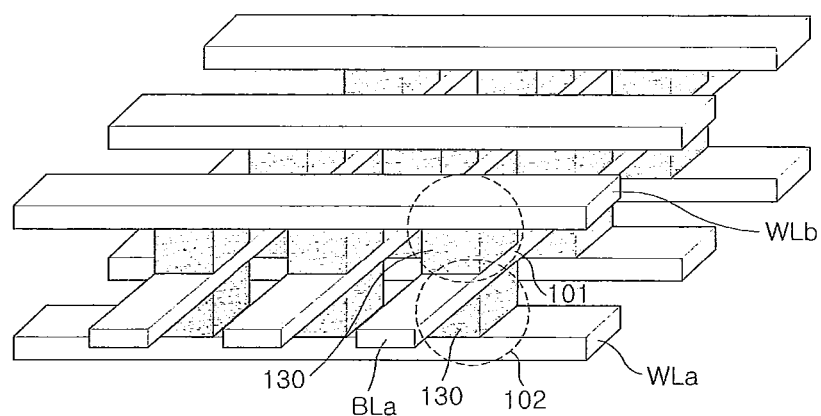
Figure 17:
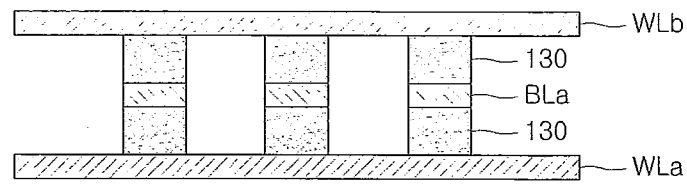

Moreover, the present invention presents multi-layer memory to provide larger capacity memory at a smaller size. FIGS. 16 and 17 illustrate embodiments of multi-layer transparent memory according to the present invention.

FIG. 16 is a perspective view showing an embodiment of multi-layer transparent memory, and FIG. 17 is a sectional view showing the embodiment of FIG. 16. As shown in FIGS. 16 and 17, transparent bit lines BLa and transparent word lines WLa and WLb are alternately stacked to form a multi-layer structure. Data storage areas 130 are formed between the transparent bit lines BLa and the transparent word lines WLa and WLb at the intersections thereof.

When the memory is formed in this way, a transparent bit line or a transparent word line disposed on the top of a relevant data storage area 130 acts as an upper transparent electrode layer, and a transparent bit line or a transparent word line disposed on the bottom of the relevant data storage area 130 acts as a lower transparent electrode layer. Referring to FIGS. 16 and 17, with respect to the data storage area 130 disposed on a lower side, a transparent bit line BLa disposed on the top of the data storage area 130 acts as an upper transparent electrode layer, and a transparent word line WLa disposed on the bottom of the data storage area 130 acts as a lower transparent electrode layer, thus forming a single memory device 102. With respect to a data storage area 130 disposed on an upper side, a transparent word line WLb disposed on the top of the data storage area 130 acts as an upper transparent electrode layer, and a transparent bit line BLa disposed on the bottom of the data storage area 130 acts as a lower transparent electrode layer, thus forming a single memory device 101.

In this way, the operation of an upper electrode layer or a lower electrode layer can be performed using one electrode line, so that larger memory capacity can be provided while the size of the memory is further reduced.

In this case, although not shown in FIGS. 13 to 17, a drive for controlling the currents of a relevant word line and a relevant bit line can be mounted so as to operate a relevant memory device.

Furthermore, in order to more effectively control the driving of a transparent memory device in the transparent electronic device, a transparent switching thin film transistor (TFT) can be provided. In the present invention, a transparent switching TFT for controlling the application of a voltage between an upper transparent electrode layer and a lower transparent electrode layer can be included to apply a predetermined voltage to a data storage area. In this way, a single data storage area and a single transparent switching TFT are provided to enable a single memory cell to be formed.

Further, a plurality of memory cells can be gathered to constitute a memory module functioning as the data storage of each cell of the transparent electronic device.

FIGS. 18 to 25 illustrate embodiments in which a transparent switching Thin Film Transistor (TFT) is provided in the transparent memory for the transparent electronic device according to the present invention.

Figure 18:
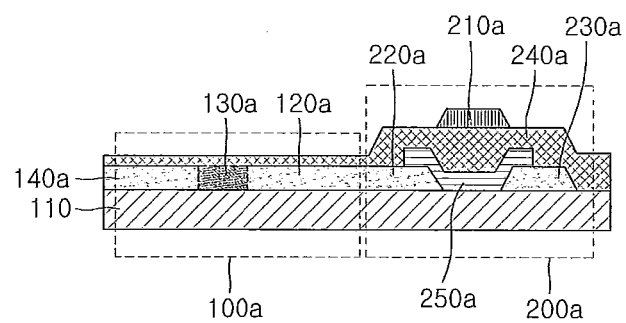
FIGS. 18 to 25 are views showing embodiments of a transparent memory cell composed of a transparent resistive memory device and a transparent switching thin film transistor according to the present invention.
Figure 19:
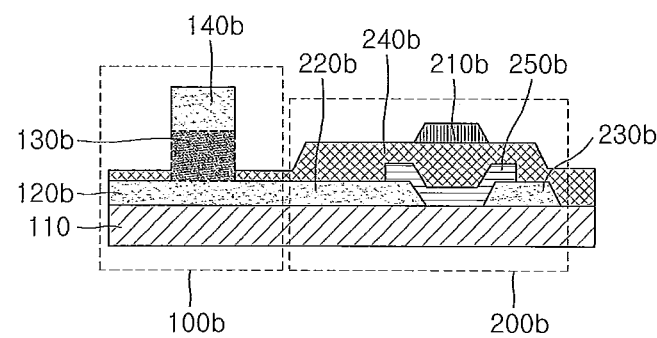

FIGS. 18 and 19 illustrate a memory cell composed of a transparent resistive memory device and a staggered type transparent switching TFT according to the present invention.

In an embodiment of FIG. 18, a lower transparent electrode layer 120a, a data storage area 130a which is formed as a transparent resistance-variable material layer, and an upper transparent electrode layer 140a are sequentially formed on a transparent substrate 110 in a lateral direction, thereby forming a transparent memory device 100a. A transparent switching TFT 200a has a top gate structure, and is formed in such a way that a source electrode layer 220a and a drain electrode layer 230a are formed on the transparent substrate 110, a semiconductor channel 250a is formed, and thereafter a gate dielectric layer 240a is applied on the semiconductor channel 250a and a gate electrode layer 210a is formed on the top of the gate dielectric layer 240a.

In this case, the lower transparent electrode layer 120a of the transparent memory device 100a and the source electrode layer 220a of the transparent switching TFT 200a are formed to be connected to each other. The transparent switching TFT 200a drives the data storage area 130a of the transparent memory device 100a in response to a signal applied to the gate 210a.

In an embodiment of FIG. 19, a lower transparent electrode layer 120b, a data storage area 130b which is formed as a transparent resistance-variable material layer, and an upper transparent electrode layer 140b are sequentially formed on a transparent substrate 110 in a vertical direction, thereby forming a transparent memory device 100b. A transparent switching TFT 200b is formed to have a top gate structure in the same manner as that of the embodiment of FIG. 18.

Figure 20:
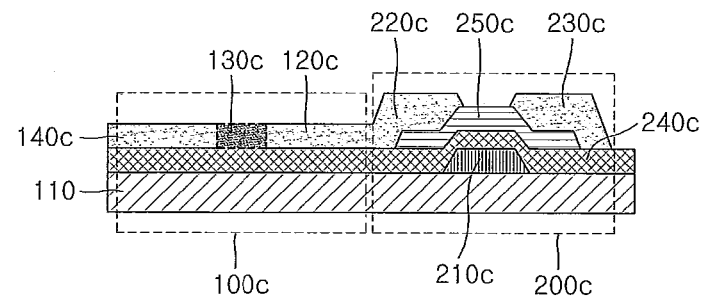
Figure 21:
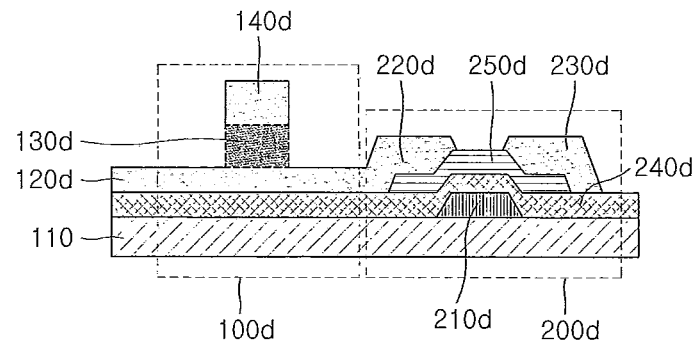

Furthermore, FIGS. 20 and 21 illustrate a memory cell composed of a transparent resistive memory device and an inverted staggered type transparent switching TFT according to the present invention.

In an embodiment of FIG. 20, similarly to the embodiment of FIG. 18, the layers of a transparent memory device 100c are sequentially formed in a lateral direction. A transparent switching TFT 200c has a bottom gate structure, and is formed in such a way that a gate electrode layer 210c is formed on the transparent substrate 110, a gate dielectric layer 240c is formed on the gate electrode layer 210c, a semiconductor channel 250c is formed on the gate dielectric layer 240c, and then a source electrode layer 220c and a drain electrode layer 230c are formed on the semiconductor channel 250c.

In this case, the source electrode layer 220c is connected to the lower transparent electrode layer 120c of the transparent memory device 100c.

In an embodiment of FIG. 21, a lower transparent electrode layer 120d, a data storage area 130d which is formed as a transparent resistance-variable material layer, and an upper transparent electrode layer 140d are sequentially formed on a transparent substrate 110 in a vertical direction, thereby forming a transparent memory device 100d. A transparent switching TFT 200d is formed to have a bottom gate structure in the same manner as that of the embodiment of FIG. 20.

Figure 22:
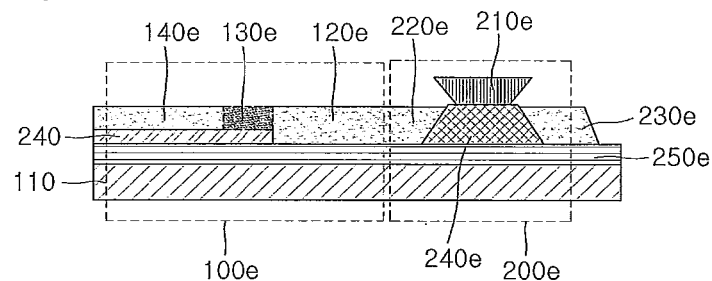
Figure 23:
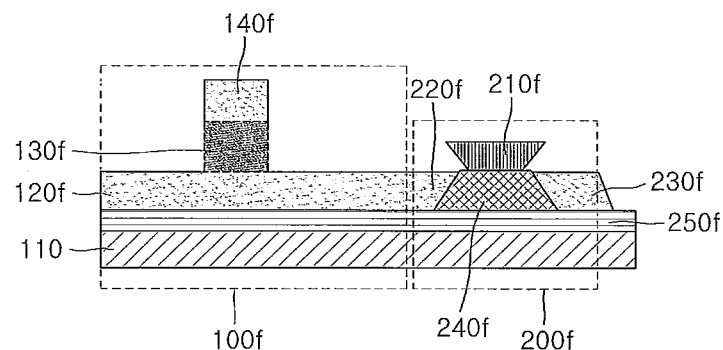

FIGS. 22 and 23 illustrate a memory cell including a coplanar type transparent switching TFT, wherein FIG. 22 shows that the layers of a transparent memory device 100e are formed in a lateral direction and FIG. 23 shows that the layers of a transparent memory device 100f are formed in a vertical direction. Each of transparent switching TFTs 200e and 200f is formed in such a way that a semiconductor channel 250e or 250f is formed on a transparent substrate 110, and that a gate dielectric layer 240e or 240f, a source electrode layer 220e or 220f, and a drain electrode layer 230e or 230f are formed on the semiconductor channel, and a gate electrode layer 210e or 210f is formed on the gate dielectric layer 240e or 240f.

In FIG. 22, a dielectric layer 240 is formed on the bottoms of both the upper transparent electrode layer 140e and the transparent resistance-variable material layer 130e of the memory device 100e so that the semiconductor channel 250e is not influenced by the upper transparent electrode layer 140e and the transparent resistance-variable material layer 130e.

Figure 24:
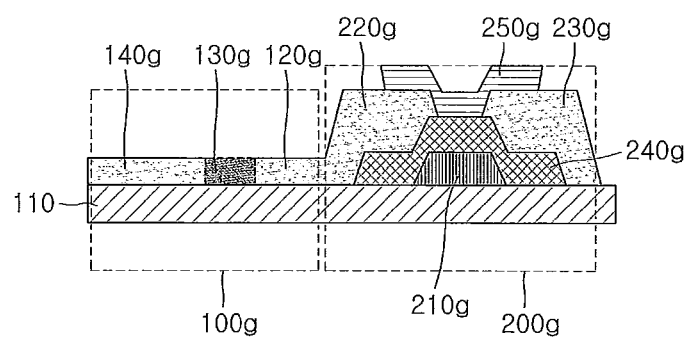
Figure 25:
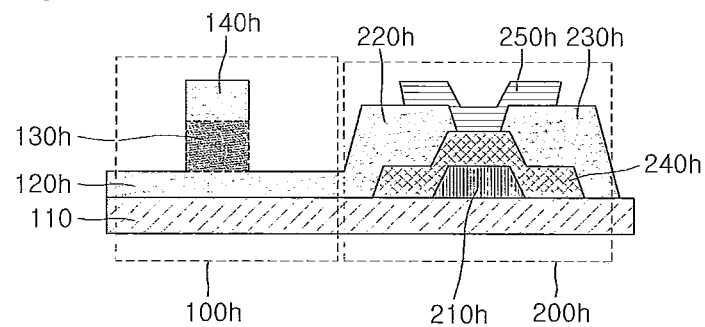

FIGS. 24 and 25 illustrate a memory cell including an inverted coplanar type transparent switching TFT, wherein FIG. 24 shows that the layers of a transparent memory device 100g are formed in a lateral direction and FIG. 25 shows that the layers of a transparent memory device 100h are formed in a vertical direction. Each of transparent switching TFTs 200g and 200h is formed in such a way that a gate electrode layer 210g or 210h is formed on a transparent substrate 110, a gate dielectric layer 240g or 240h is formed on the gate electrode layer 210g or 210h, and thereafter a source electrode layer 220g or 220h, a drain electrode layer 230g or 230h, and a semiconductor channel 250g or 250h are formed.

In the transparent switching TFT in the embodiments of FIGS. 18 to 25, each of the dielectric layer 240 and the gate dielectric layers 240a to 240h can be made of a transparent oxide ($SiO_2$)-based material, a transparent nitride ($Si_3N_4$)-based material, or another transparent nonconducting material. The gate electrode layers 210a to 210h, the source electrode layers 220a to 220h, and the drain electrode layers 230a to 230h can be made of transparent electrode-forming materials such as ITO, ZnO, $SnO_2$, IZO, ITZO, CNT, NiOx or the like. Further, the semiconductor channels 250a to 250h can be made of an oxide-based material, such as SnO, CdSnO, GaSnO, TlSnO, InGaZnO, CuAlO, SrCuO, LaCuOS, $TiO_2$, ZnO, CdO, $SnO_2$, IGZO (In—Ga—Zn—O), $In_2O_3$, $Mg_xZn_{1-x}O$, $Cd_xZn_{1-x}O$, ZnO:Ni, ZnO:Al, $Mg_xZn_{1-x}O$:Ni, or $Cd_xZn_{1-x}O$:Ni, or a nitride-based material, such as GaN, InGaN, AlGaN, InGaAlN, or $Al_xGa_{1-x}N$:H, or various types of semiconductor materials such as carbide-based SiC or diamond.

Furthermore, the transparent substrate 110 can also be implemented as a flexible transparent substrate. The flexible transparent substrate may be made of a polymer material such as polyester (PET), polyethylenenaphalate (PEN), polyetherimide (PEI), polyetheretherketone (PEEK), polyethersulphone (PES), polyarylate (PAR), polyimide (PI) or polycarbonate (PC), or a transparent and flexible plastic material.

Figure 26:
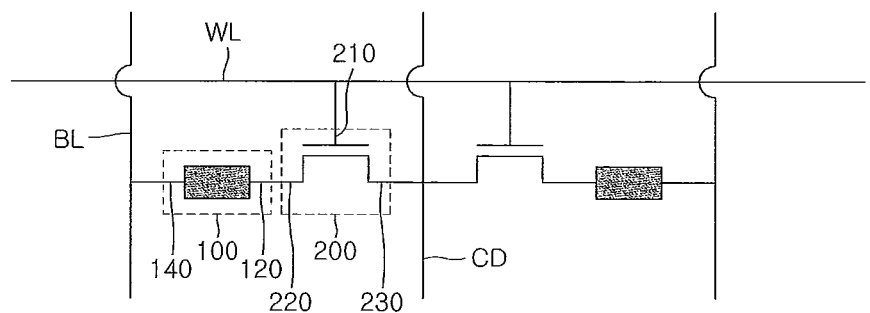
FIG. 26 is a schematic circuit diagram showing a transparent memory array composed of transparent memory cells according to the present invention.

An array is formed using the above-described transparent memory cells according to the present invention, and can be used as the memory of each cell of a transparent electronic device. FIG. 26 is a schematic circuit diagram showing a transparent memory array in which memory cells according to the embodiments of the present invention shown in FIGS. 18 to 25 are applied to a transparent electronic device.

As shown in FIG. 26, a single transparent memory device 100 and a single transparent switching TFT 200 according to the present invention are provided to constitute a single transparent memory cell, and a plurality of transparent memory cells are formed to be spaced apart from one another by a predetermined interval to form a transparent memory array.

In order to drive the transparent memory array formed in this way, a plurality of transparent word lines WL are formed in a lateral direction, and a plurality of transparent bit lines BL are formed in a vertical direction, as shown in FIG. 26, so that the transparent memory devices 100 can be driven by the respective transparent switching TFTs 200 that are operated by the current flow of the transparent word lines WL and the transparent bit lines BL.

In detail, the upper transparent electrode layer 140 of each transparent memory device 100 is connected to a relevant transparent bit line BL, the lower transparent electrode layer 120 thereof is connected to the source electrode 220 of a corresponding transparent switching TFT 200, and the gate electrode 210 of the transparent switching TFT 200 is connected to the transparent word line WL.

A relevant transparent switching TFT 200 turns on/off the memory function of the transparent memory device 100 connected thereto according to the current flow of the transparent word line WL and the transparent bit line BL. This causes a voltage difference between the upper transparent electrode layer 140 and the lower transparent electrode layer 120 of the transparent memory device 100 due to the transparent switching TFT 200. This voltage difference causes a variation in the resistance of the data storage area 130 which is the transparent resistance-variable material layer, thus enabling the data storage area 130 to function as memory.

As described above, in the case where the transparent memory for the transparent electronic device according to the present invention is applied to transparent electronic products, the transparent memory device is not influenced by the size of the substrate thereof when being manufactured, and thus the transparent memory device can be directly applied to electronic devices mounted on transparent large-size displays or the like.

Further, since a flexible substrate is used, a transparent electronic device that is not damaged by bending or the like attributable to external force and is flexible and easily portable can be manufactured.

The above description is only intended to illustratively describe the technical spirit of the present invention, and those skilled in the art will change and modify the present invention in various manners without departing from the scope of the essential features of the present invention. Therefore, the embodiments of the present invention are not intended to limit the technical spirit of the present invention and are merely intended to describe the embodiments, and the technical spirit of the present invention is not limited by those embodiments. The scope of the present invention should be defined by the accompanying claims, and all technical spirit of the claims and equivalents thereof should be interpreted as being included in the scope of the present invention.

The invention claimed is:

1. A transparent memory for a transparent electronic device, comprising:
   a lower transparent electrode layer, a data storage area, and an upper transparent electrode layer sequentially formed on a transparent substrate, the data storage area being formed as at least one transparent resistance-variable material layer,
   wherein the transparent resistance-variable material layer has switching characteristics depending on resistance variations based on a predetermined voltage that is applied between the lower transparent electrode layer and the upper transparent electrode layer, has an optical band gap of 3 eV or more, and has a visible light transmittance of 80% or more.

2. The transparent memory according to claim 1, wherein the data storage area is formed in such a way that at least two transparent resistance-variable material layers are bound to each other in a heterojunction manner.

3. The transparent memory according to claim 1, wherein the transparent resistance-variable material layer comprises at least one of zinc (Zn), titanium (Ti), hafnium (Hf), zirconium (Zr), aluminum(Al), tantalum (Ta), yttrium (Y), vanadium (V), chromium (Cr), manganese (Mn), iron (Fe), cobalt (Co), nickel (Ni), copper (Cu), niobium (Nb), and molybdenum (Mo), as a transition metal oxide.

4. The transparent memory according to claim 1, wherein the transparent resistance-variable material layer comprises manganese (Mn), which is a metal material having magneto-resistance, as a metal oxide having magneto-resistance.

5. The transparent memory according to claim 1, wherein the transparent resistance-variable material layer comprises at least one of compounds of strontium (Sr), zirconium (Zr) and titanium (Ti), as a ferroelectric material.

6. The transparent memory according to claim 3, wherein:
   the data storage area is foimed as at least two transparent resistance-variable material layers, and
   the transparent resistance-variable material layers are made of one type of transition metal oxide having different oxygen compositions.

7. The transparent memory according to claim 1, wherein each of the lower transparent electrode layer and the upper transparent electrode layer comprises any one selected from among a transparent conducting oxide (TCO), a transparent conducting polymer, and a transparent conducting carbon nano tube (CNT).

8. The transparent memory according to claim 7, wherein:
   the transparent conducting oxide is one of zinc oxide (ZnO), tin oxide ($SnO_2$), indium zinc oxide (IZO), indium tin zinc oxide (ITZO), and indium tin oxide (ITO), and
   the conducting polymer is either poly(3,4-ethylenedioxythiophene)-poly(styrene sulfonate) (PEDOT-PSS) or polyaniline (PANi).

9. The transparent memory according to claim 1, wherein the transparent substrate is made of any one selected from among glass, a polymer, and plastic.

10. The transparent memory according to claim 1, further comprising:
    a plurality of transparent bit lines arranged in parallel in a vertical direction to be spaced apart from one another by a predetermined interval; and
    a plurality of transparent word lines arranged in parallel in a lateral direction to be spaced apart from one another by a predetermined interval,
    wherein data storage areas are formed between the transparent bit lines and the transparent word lines at intersections of the transparent bit lines and the transparent word lines, a transparent bit line at each intersection acts as an upper transparent electrode layer, and a transparent word line at each intersection acts as a lower transparent electrode layer.

11. The transparent memory according to claim 10, wherein:
    the transparent bit lines and the transparent word lines are alternately arranged to form a multi-layer structure, and
    a transparent bit line or a transparent word line disposed on a top of a relevant data storage area acts as an upper transparent electrode layer, and a transparent bit line or a transparent word line disposed on a bottom of the data storage area acts as a lower transparent electrode layer.

12. The transparent memory according to claim 1, further comprising a transparent switching thin film transistor configured to control application of a predetermined voltage between the lower transparent electrode layer and the upper transparent electrode layer, thus forming a single memory cell.

13. The transparent memory according to claim 12, wherein:
    the lower transparent electrode layer is connected to a source electrode of the transparent switching thin film transistor, and the memory cell is operated in response to a gate electrode signal of the transparent switching thin film transistor.

14. The transparent memory according to claim 13, further comprising:
- a plurality of transparent bit lines arranged in parallel in a vertical direction to be spaced apart from one another by a predetermined interval; and
- a plurality of transparent word lines arranged in parallel in a lateral direction to be spaced apart from one another by a predetermined interval,
- wherein memory cells are formed between the transparent bit lines and the transparent word lines at intersections of the transparent bit lines and the transparent word lines, so that a gate electrode of a transparent switching thin film transistor of each memory cell is connected to a transparent word line at a corresponding intersection, and a transparent bit line at the corresponding intersection acts as an upper transparent electrode layer.

15. The transparent memory according to claim 14, wherein:
- the bit lines and the word lines are alternately arranged to form a multi-layer structure, and
- a bit line or a word line disposed on a top of a data storage area of the memory cell acts as an upper transparent electrode layer, and a bit line or a word line disposed on a bottom of the data storage area is connected to the gate electrode of the transparent switching thin film transistor of the memory cell.

* * * * *

UNITED STATES PATENT AND TRADEMARK OFFICE
CERTIFICATE OF CORRECTION

PATENT NO. : 8,426,841 B2  
APPLICATION NO. : 13/128983  
DATED : April 23, 2013  
INVENTOR(S) : Jung Won Seo et al.

Page 1 of 1

It is certified that error appears in the above-identified patent and that said Letters Patent is hereby corrected as shown below:

Title Page, Column 1, Item (86) § 371 (c)(1), (2), (4) Date, Line 1,
delete "Aug. 4, 2011" and insert -- Jul. 5, 2011 --

In the Claims:

Column 16, Line 10, Claim 6, delete "foimed" and insert -- formed --

Signed and Sealed this
Thirteenth Day of August, 2013

Teresa Stanek Rea
*Acting Director of the United States Patent and Trademark Office*

UNITED STATES PATENT AND TRADEMARK OFFICE
CERTIFICATE OF CORRECTION

PATENT NO.       : 8,426,841 B2
APPLICATION NO. : 13/128983
DATED            : April 23, 2013
INVENTOR(S)      : Seo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 123 days.

Signed and Sealed this
Eighth Day of September, 2015

Michelle K. Lee
*Director of the United States Patent and Trademark Office*